United States Patent [19]

Okuda

[11] 4,056,952
[45] Nov. 8, 1977

[54] DIAMOND BEARING MICROSCOPIC CERTIFICATE OF APPRAISAL

[76] Inventor: Kazumi Okuda, No. 55-12-807, 2-Chome, Sangenjaya, Setagaya, Tokyo, Japan

[21] Appl. No.: 672,835

[22] Filed: Apr. 1, 1976

[30] Foreign Application Priority Data

Jan. 23, 1976  Japan ..................... 51-5887

[51] Int. Cl.² ............................................. A44C 17/00
[52] U.S. Cl. .......................................... 63/32; 40/2.2; 156/664
[58] Field of Search .............. 63/32; 40/2.2, 2 R; 156/8, 18

[56] References Cited

U.S. PATENT DOCUMENTS

| 1,902,830 | 3/1933 | Bulova ........................... 63/1 |
| 2,093,601 | 9/1937 | Drescher ....................... 40/2 R |
| 3,571,957 | 3/1971 | Cumming ..................... 40/2.2 |
| 3,576,630 | 4/1971 | Yanagawa ................. 156/8 X |
| 3,959,527 | 5/1976 | Droege ....................... 156/8 X |

FOREIGN PATENT DOCUMENTS

| 1,047,620 | 7/1953 | France ......................... 40/2.2 |
| 2,512,983 | 10/1975 | Germany .................... 40/2.2 |

*Primary Examiner*—F. Barry Shay

[57] ABSTRACT

A diamond with an inscription comprises a diamond gem structure having an outer surface cut and polished into a specific shape and a microscopic inscription formed at a specific position on the outer surface of the diamond gem structure. The inscription has a pattern indicating the results of expert appraisal of the diamond gem structure. The inscription may be formed by a method including cleaning a selected portion of the stone surface, depositing a layer of metal thereon, coating the metal with a photoresist film, producing thereon a photo impression by using a mask, developing the impression, etching away the uncoated metal portions and then removing the photoresist.

6 Claims, 13 Drawing Figures

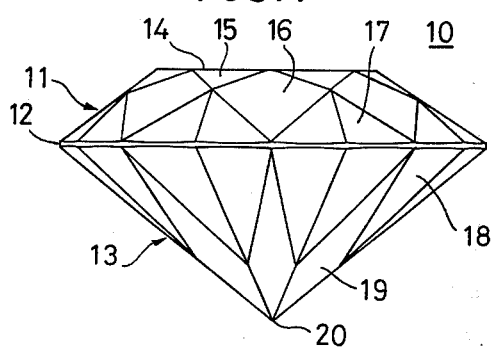
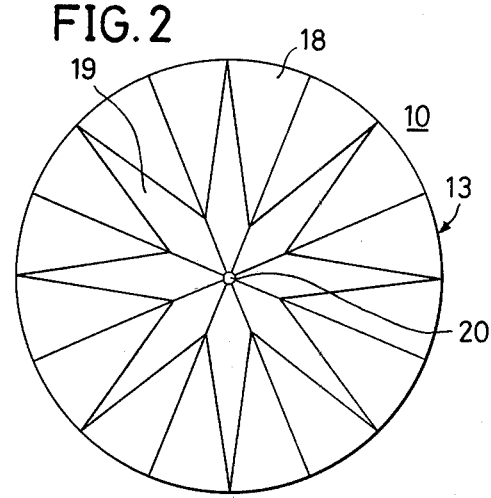
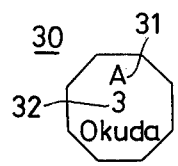
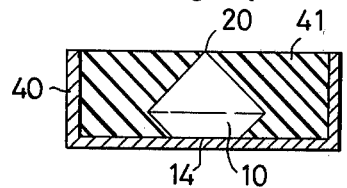
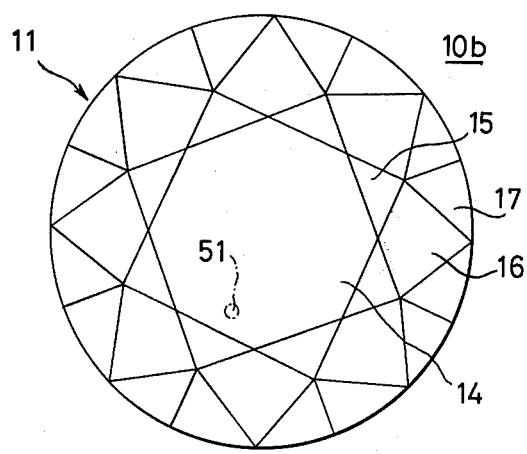
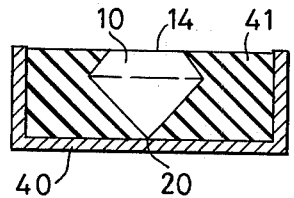

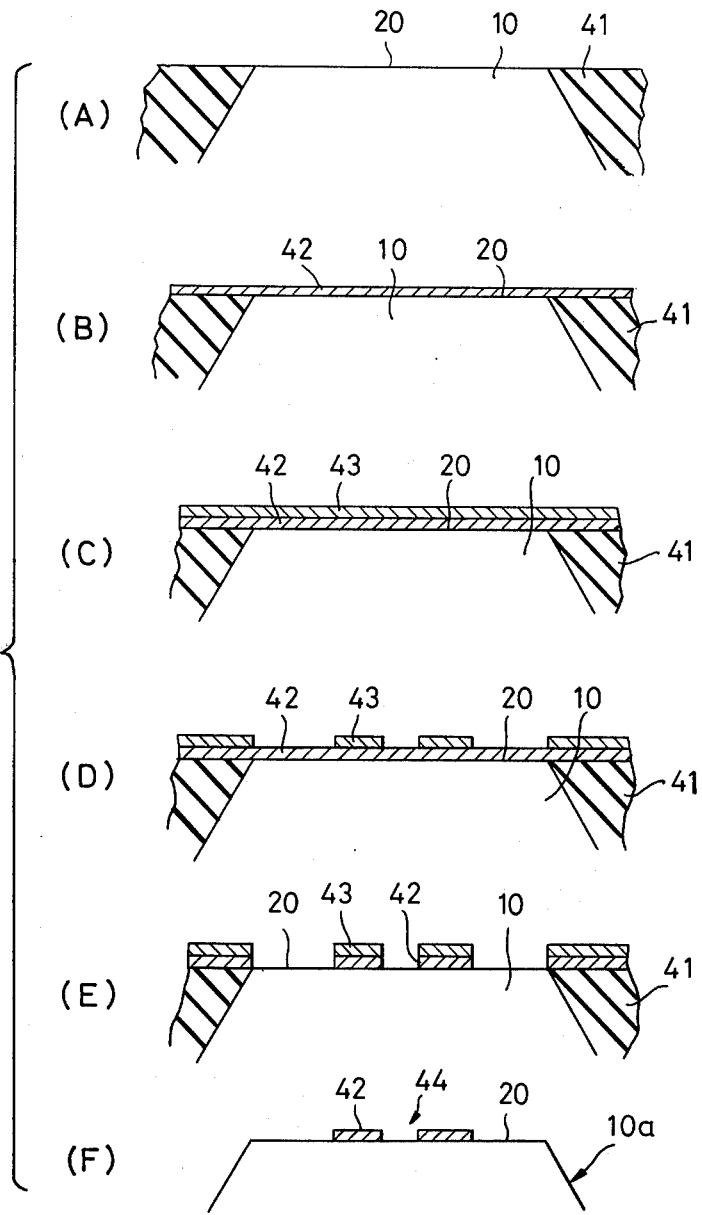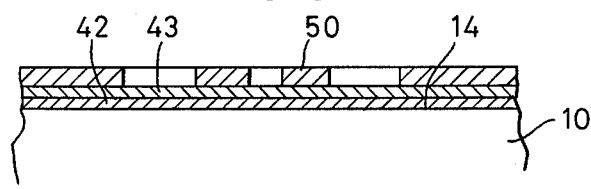

DIAMOND BEARING MICROSCOPIC CERTIFICATE OF APPRAISAL

BACKGROUND OF THE INVENTION

The present invention relates generally to diamonds with inscriptions and more particularly to diamond gems bearing inscriptions certifying and guaranteeing particulars such as the gem quality and the number of carats of the diamond gem structure. This invention concerns gems of diamonds, that is, diamonds of value which have been cut and polished, but for the sake of brevity these gems will hereinafter be referred to simply as "diamonds".

In general, it has been customary in the lapidary trade to provide diamonds, for ornamental use and the like for commercial transactions upon completion of cutting and polishing, with certificates of appraisal or written expert opinions on which are recorded particulars such as the numbers of carats, color grades, and presence or absence of defects (flaws) of the diamonds in order to certify and guarantee the gem quality thereof.

However, since a certificate of appraisal of this kind and the diamond described and certified thereby are separate objects, there is the risk of loss of the certificate, which therefore requires care in the custody thereof. If the certificate should be lost or destroyed, a troublesome appraisal would again become necessary, and a certificate of appraisal must be made anew.

Furthermore, there are instances of forgery of, appraisal certificates. For this reason, great care must be exercised during a transaction in judging whether or not each certificate is correct and genuine. Because these appraisal certificates are thus separate from their respective diamonds, it cannot be said that they are completely reliable. For this reason, it is a fact of reality in the present state of the trade that an appraisal certificate is verified by again carrying out the above mentioned troublesome appraisal particularly during a transaction for a high-priced diamond.

Furthermore, while properties such as color grade and flaws of a diamond can be readily appraised even when it is in a mounted state on an object such as a ring, the weight in carats of the diamond cannot be determined. For this reason, in a case where a party insists on a reappraisal of the weight of such a diamond, it must be detached from its setting, which ordinarily means the destruction of the setting.

SUMMARY OF THE INVENTION

Accordingly, it is a general object of the present invention to provide novel and useful diamonds with inscriptions which solve the above described problems.

Another and more specific object of the invention is to provide diamonds having inscriptions provided directly thereon and certifying the gem quality. By this provision according to the invention, the inscriptions take the place of certificates of appraisal, which may henceforth become unnecessary and be dispensed with. Since the inscriptions certifying gem quality are provided integrally with their respective diamonds, there is no longer any possibility of undesirable occurrences such as loss or forgery of conventional certificates of appraisals separate from their diamonds. Moreover, there is no longer any necessity of verification of correspondence between a diamond and its appraisal certificate. Furthermore, there is no necessity of dismounting a diamond from a setting such as a ring to reappraise its carat value Still another object of the invention is to provide diamonds provided with the above mentioned inscriptions without any impairment whatsoever of the gem quality and commercial value of the diamonds for ornamental use.

Other objects and further features of the invention will be apparent from the following detailed description with respect to preferred embodiments of the invention when read in conjunction with the accompanying drawings.

BRIEF DESCRIPTION OF THE DRAWINGS

In the drawings,

FIG. 1 is a side view showing one example of a brilliant cut diamond;

FIG. 2 is a bottom view of the diamond shown in FIG. 1;

FIG. 3 is a plan view showing one embodiment of a photomask having a pattern in accordance with an inscription to be formed on a diamond;

FIG. 4 is a side view, partly in section, indicating an intermediate state in the processing of one embodiment of a diamond with inscription according to the invention;

FIGS. 5(A) through 5(F) are enlarged partial sectional views for a description of one embodiment of an inscription forming process;

FIG. 6 is a top plan view of another embodiment of a diamond with inscription according to the invention;

FIG. 7 is a side view, partly in section, indicating intermediate states in the processing of another embodiment of a diamond with inscription according to the invention; and FIG. 8 is a enlarged fragmentary sectional view indicating an intermediate state in the processing of another embodiment.

DETAILED DESCRIPTION

A brilliant cut diamond, which will be taken as one example of a diamond on which an inscription is to be formed in accordance with the present invention, has a shape as indicated in FIGS. 1 and 2. The diamond has a structure 10 that comprises a crown 11, a girdle 12, and a pavilion 13. The crown 11 has a table surface 14, star facets 15, bezel facets 16, and crown girdle facets 17. The pavilion 13 has pavilion girdle facets 18, pavilion facets 19, and a culet 20. These surfaces are cut and polished surfaces.

In a first embodiment of the invention, an inscription is formed on the culet 20 of the diamond.

As a first step in this inscription forming process, a photomask 30 of a pattern as shown in FIG. 3, for example, is formed by an ordinary photographic technique or photo-etching technique. This photomask 30 is designed to indicate an inscription comprising marks 31, numerals 32, and the like representing necessary appraisal particulars of the diamond such as carat number, color grade, and presence or absence of flaws, which have resulted from an appraisal. In this connection, the pattern of the photomask 30 is of a size which is a magnification of, for example, approximately 2,000 times that of the inscription to be formed.

On one hand, the diamond 10 on which the inscription is to be formed is placed with its culet 20 above and its table 14 below in a case 40. Next, a resin 41 is poured into the case 40 to a level at which the culet 20 is slightly covered thereby to fix the diamond 10 embeddedly in the resin 41.

The upper surface of the resin 41 is thereafter ground thereby to expose the culet 20 of the diamond 10 as indicated in FIG. 5(A). Then, as indicated in FIG. 5(B), a layer 42 of a metal which does not readily deteriorate, such as chromium, is formed by a process such as evaporation deposition on the culet 20. Prior to this step, the surface of the culet 20 should be cleaned in order to obtain intimate and secure adhesion of the metal layer 42 to this culet surface 20 of the diamond 10.

On this metal layer 42, a photoresist such as AZ-1350 (trade name) is applied as a coating to form a photoresist film 43 as shown in FIG. 5(C). Then, by means of an optical system (not shown) at an intermediate point of which the aforementioned photomask 30 is mounted, the pattern of the photomask 30 is reduced in size, for example to 1/2,000 and projected on this photoresist layer 43 thereby to effect photographic exposure. Thereafter, as indicated in FIG. 5(D), developing is carried out, and parts of the photoresist are removed in accordance with the printed pattern. Next, parts of the metal layer 42 which have been exposed by the removal of the photoresist are removed by an film etching process as indicated in FIG. 5(E). The remaining photoresist 43 is thereafter removed.

Finally, the resin 41 is melted by heating, and the diamond thus released is taken out, whereupon a diamond 10a bearing on its culet surface 20 an inscription 44 constituted by the remaining parts of the metal layer 42 in a pattern in accordance with the pattern of the mask 30 is obtained.

The size of the pattern of the inscription 44 formed in the above described manner (see FIG. 5(F)) is of the order of 0.1 mm. in diameter, for example. On one hand, the diameter of the culet 20 is of the order of 0.2 to 0.3 mm., for example. Therefore, there is ample space on the culet 20 for forming an inscription. Furthermore, since the inscription is very minute as mentioned above, it cannot impair the original ornamental beauty or value of the diamond.

When the inscription 44 formed as described above is to be read, it is read directly by means of optical magnifying means such as a microscope in the case where the diamond 10a is not mounted on another object such as a ring setting. In the case where the diamond 10a is mounted on a ring setting or the like, the inscription is read by placing the objective lens of a microscope in a position to confront the table 14 of the diamond.

In the above described embodiment of the invention, the culet 20 is very small, being of the order of 0.2 to 0.3 mm., for example. Furthermore, the photomask 30 is placed in the aforementioned optical system for photographic exposure at a position separated from the culet 20 of the diamond. For these reasons, it is difficult to focus the pattern of the photomask 30 accurately on the culet, whereby fine adjustment is required. Thus, there arises the problem of troublesome work.

This problem has been solved by a second embodiment of the invention as described below, in which an inscription is formed on the surface of the table 14 of the diamond 10.

In the formation of the inscription, a mask 50, as shown in FIG. 8, having a pattern corresponding to the result of an appraisal is first prepared similarly as in the case of the pattern shown in FIG. 3. The pattern of the mask to be used in the instant embodiment of the invention, however, is of the same size (for example, a diameter of 0.1 mm.) as the inscription to be formed.

On one hand, the diamond 10 on which the inscription is to be formed is placed with its culet 20 below and its table 14 above in the case 40 and is embeddedly set in the case 40 by pouring the resin 41 thereinto as shown in FIG. 7. Then, after the table 14 has been made clean, a layer 42 of a metal such as chromium is deposited by evaporation on the table 14 similarly as in the preceding embodiment of the invention, and a photoresist film 43 is further formed thereon by application as a coating.

Then, as indicated in FIG. 8, a mask 50 having the above mentioned pattern is placed in intimate contact on the photoresist film 43. With the mask 50 in this state, light is projected thereonto to carry out exposure, whereupon only the parts of the photoresist film 43 corresponding to the pattern of the mask 50 are exposed to light. The mask 50 is then removed, and thereafter the steps of development of the photoresist film 43, the etching of the metal layer 42, the removal of the photoresist, and succeeding steps are carried out similarly as in the preceding embodiment of the invention. As a result, a diamond 10b having an inscription 51 formed on the table 14 thereof as shown in FIG. 6 is obtained.

In accordance with the instant embodiment of the invention, the inscription can be formed at almost any position since the surface of the table 14 is wide. Furthermore, since it is sufficient merely to place the mask 51 in intimate contact with the photoresist film 43, the work of adjusting the position of the mask at the time of photographic exposure, as in the preceding embodiment of the invention, is not necessary, whereby the work of forming the inscription is greatly facilitated.

While the inscription 51 on the table 14 in FIG. 6 is shown in a greatly enlarged state, it is actually very small, being of the order of 0.1 mm. and thereby being almost imperceptible by naked eye. Therefore, this inscription 51 cannot impair the aesthetic value of the diamond for ornamental purposes.

When the inscription 51 is to be read, it can be readily pin-pointed by scanning the surface of the table 14 with lowered magnification of a microscope of the order of 100 times thereby to widen the field of vision.

In accordance with the present invention, the surfaces on which the inscription is formed need not be limited to the culet and table of the diamond as in the embodiments of the invention described above but may be any other facet. Furthermore, instead of embeddedly setting the diamond 10 in a resin 41 for the purpose of holding the same, the diamond may be held by clamping it at its girdle 12 part.

Further, this invention is not limited to these embodiments but various variations and modifications may be made without departing from the scope and spirit of the invention.

What is claimed is:

1. A diamond with an inscription, comprising a diamond gem structure having an outer surface cut and polished into a specific shape, and integrally provided means intimately and securely adhered to said gem structure for functioning as a permanent certificate of appraisal of the diamond, said means including a microscopic inscription formed at a specific position on said outer surface, said inscription having a pattern indicating the results of expert appraisal of said gem structure.

2. The diamond as defined in claim 1, wherein said gem structure has a culet, and said inscription is formed on said culet.

3. The diamond as defined in claim 1, wherein said gem structure has a table, and said inscription is formed on said table.

4. The diamond as defined in claim 3, wherein said inscription is formed by causing a metal layer to adhere to said table, forming a photoresist film on said metal layer, causing a mask having said pattern to lie intimately on said film, exposing to light said mask and unmasked parts of said film, developing said film, and subjecting said metal layer to etching.

5. The diamond as defined in claim 1, wherein said inscription is formed by causing a metal layer to adhere to said outer surface and subjecting said metal layer to a photo-etching process.

6. The diamond as defined in claim 5, wherein said metal layer is a layer of chromium.

* * * * *